(12) United States Patent
Namiki et al.

(10) Patent No.: US 11,794,606 B2
(45) Date of Patent: Oct. 24, 2023

(54) MANAGEMENT DEVICE, MANAGEMENT METHOD, AND PROGRAM

(71) Applicant: HONDA MOTOR CO., LTD., Tokyo (JP)

(72) Inventors: Shigeru Namiki, Wako (JP); Minoru Uoshima, Wako (JP); Makoto Nishigaki, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 59 days.

(21) Appl. No.: 17/611,593

(22) PCT Filed: Jun. 17, 2019

(86) PCT No.: PCT/JP2019/023874
§ 371 (c)(1),
(2) Date: Nov. 16, 2021

(87) PCT Pub. No.: WO2020/255196
PCT Pub. Date: Dec. 24, 2020

(65) Prior Publication Data
US 2022/0144130 A1    May 12, 2022

(51) Int. Cl.
*B60L 58/12*    (2019.01)
*G01R 31/389*    (2019.01)
*G01R 31/3842*    (2019.01)

(52) U.S. Cl.
CPC ............ *B60L 58/12* (2019.02); *G01R 31/389* (2019.01); *G01R 31/3842* (2019.01); *B60L 2240/545* (2013.01); *B60L 2240/547* (2013.01)

(58) Field of Classification Search
None
See application file for complete search history.

(56) References Cited

U.S. PATENT DOCUMENTS

2014/0188304 A1 * 7/2014 Richter ................... B60L 58/12
                                                                    701/1
2015/0357852 A1 * 12/2015 Nakao ................... H01M 10/48
                                                                    702/63
(Continued)

FOREIGN PATENT DOCUMENTS

JP    2013-084198    5/2013
JP    2013-243913    12/2013
(Continued)

OTHER PUBLICATIONS

International Search Report and Written Opinion for International Application No. PCT/JP2019/023874 dated Aug. 20, 2019, 8 pages.

*Primary Examiner* — Jas A Sanghera
(74) *Attorney, Agent, or Firm* — AMIN, TUROCY & WATSON, LLP

(57) ABSTRACT

A management device includes an information acquirer configured to acquire battery information on a usage state of a secondary battery mounted in a vehicle and information on a user from the vehicle, a first feature deriver configured to derive a first feature indicating a state of the secondary battery based on a result obtained by applying the battery information to a battery state detection model that identifies the state of the secondary battery, a second feature deriver configured to derive a second feature indicating characteristics of the user based on the information on the user, and a selector configured to select a battery suitable for the user based on a result obtained by inputting the first feature and the second feature to a matching model that outputs a result showing compatibility between the user and a battery based on the first feature and the second feature.

5 Claims, 11 Drawing Sheets

(56) References Cited

U.S. PATENT DOCUMENTS

2015/0369867 A1 12/2015 Kanada
2017/0242079 A1* 8/2017 Duan .................... B60L 58/15

FOREIGN PATENT DOCUMENTS

JP   2016-008873   1/2016
WO   2018/104965   6/2018

* cited by examiner

BATTERY STATE DETECTION MODEL M1

USER CHARACTERISTIC DETECTION MODEL M2

MATCHING MODEL M3

USER CHARACTERISTIC DETECTION MODEL M4

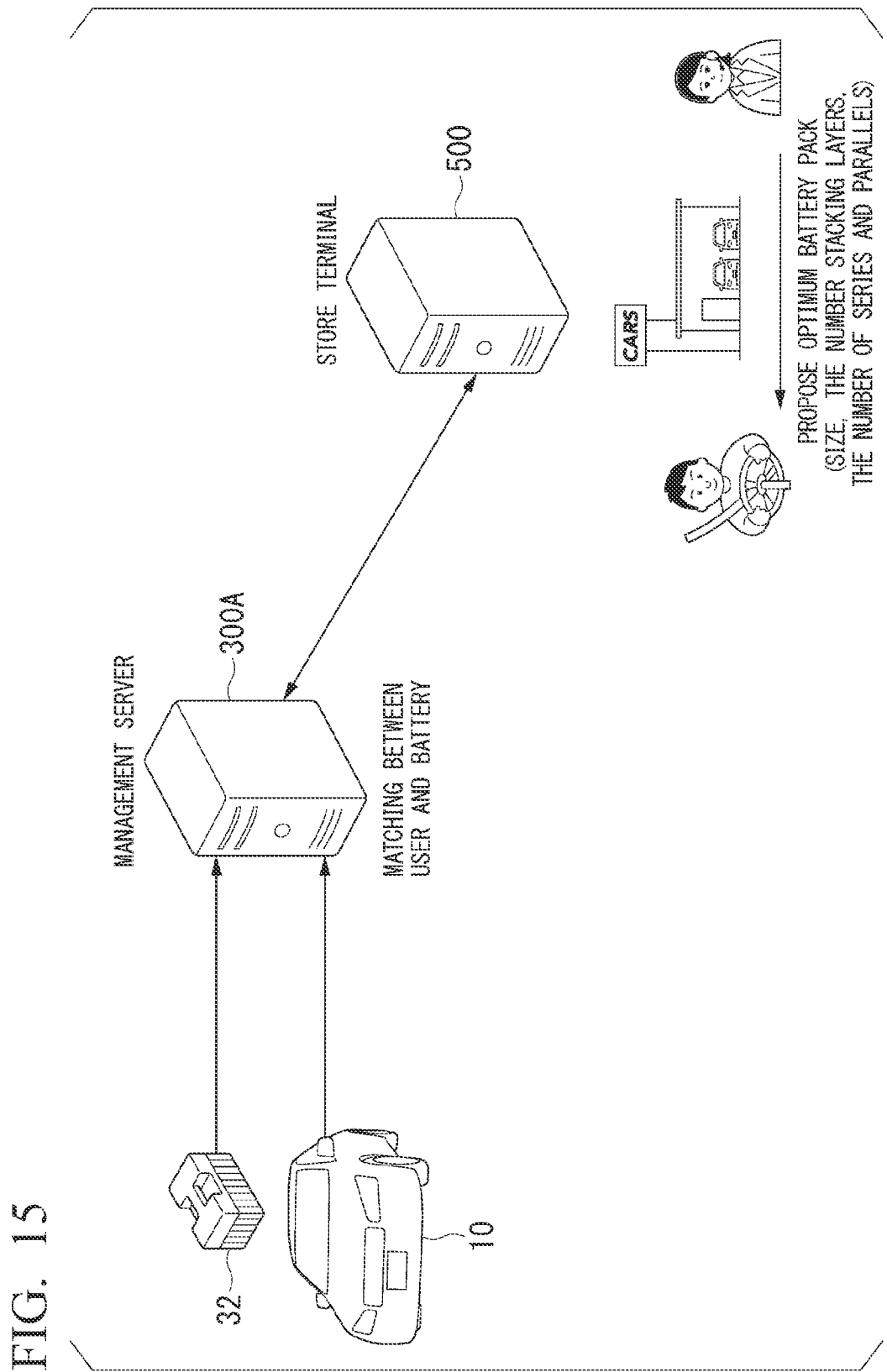

MANAGEMENT DEVICE, MANAGEMENT METHOD, AND PROGRAM

TECHNICAL FIELD

The present invention relates to a management device, a management method, and a program.

BACKGROUND ART

Batteries (secondary batteries) such as lithium-ion batteries are used in electrically powered vehicles such as electric vehicles and hybrid vehicles. In order to ensure a stable supply of batteries in the future, it is considered effective to actively utilize a secondary usage. Conventionally, a technology related to a device and a method for providing energy management and maintenance of a secondary used battery through the use of a secondary service port have been disclosed (for example, refer to Patent Literature 1).

CITATION LIST

Patent Literature

Patent Literature 1

Japanese Unexamined Patent Application, First Publication No. 2013-243913

SUMMARY OF INVENTION

Technical Problem

However, when a user purchases a vehicle or a battery through a dealer, or the like, it is not possible to provide an appropriate battery without considering the usage of a vehicle or a battery by the user.

The present invention has been made in consideration of such circumstances, and is to provide a management device, a management method, and a program capable of proposing a battery suitable for a user.

Solution to Problem

A management device, a management method, and a program according to the present invention have adopted the following configuration.

(1): A management device according to one aspect of the present invention includes an information acquirer configured to acquire battery information on a usage state of a secondary battery mounted in a vehicle and information on a user from the vehicle, a first feature deriver configured to derive a first feature indicating a state of the secondary battery based on a result obtained by applying the battery information to a battery state detection model that identifies the state of the secondary battery, a second feature deriver configured to derive a second feature indicating characteristics of the user based on the information on the user, and a selector configured to select a battery suitable for the user based on a result obtained by inputting the first feature and the second feature to a matching model that outputs a result showing compatibility between the user and a battery based on the first feature and the second feature.

(2): In the aspect of (1) described above, the information acquirer acquires vehicle information on a traveling state of the vehicle as the information on the user, and the second feature deriver derives the second feature based on a result obtained by applying the vehicle information to a user categorized model that identifies characteristics of the user.

(3): In the aspect of (1) described above, the information acquirer acquires a detection value indicating a usage state of the secondary battery as the battery information, and the first feature deriver derives a feature that identifies the state of a battery as the first feature by expressing a result obtained by applying the battery information to the battery state detection model using a three-dimensional space model defined by a capacity of the secondary battery, an SOC-OCV curve of the secondary battery, and an internal resistance of the secondary battery.

(4): In the aspect of (3) described above, the information acquirer acquires information indicating a current, a voltage, and a temperature when the secondary battery is charged or discharged as the detection value.

(5): A management method according to another aspect of the present invention includes, by a computer, acquiring battery information on a usage state of a secondary battery mounted in a vehicle and information on a user from the vehicle, deriving a first feature indicating a state of the secondary battery based on a result obtained by applying the battery information to a battery state detection model that identifies a state of the secondary battery, deriving a second feature indicating characteristics of the user based on the information on the user, and selecting a battery suitable for the user based on a result obtained by inputting the first feature and the second feature to a matching model that outputs a result showing compatibility between the user and a battery based on the first feature and the second feature.

(6): A computer-readable non-transitory storage medium storing a program causing a computer to execute: acquiring battery information on a usage state of a secondary battery mounted in a vehicle and information on a user from the vehicle, deriving a first feature indicating a state of the secondary battery based on a result obtained by applying the battery information to a battery state detection model that identifies a state of the secondary battery, deriving a second feature indicating characteristics of the user based on the information on the user, and selecting a battery suitable for the user based on a result obtained by inputting the first feature and the second feature to a matching model that outputs a result showing compatibility between the user and a battery based on the first feature and the second feature.

Advantageous Effects of Invention

According to (1) to (6), it is possible to propose a battery suitable for a user.

BRIEF DESCRIPTION OF DRAWINGS

FIG. 15 is a reference diagram that describes a specific example of a second embodiment.

DESCRIPTION OF EMBODIMENTS

First Embodiment

Figure 1:
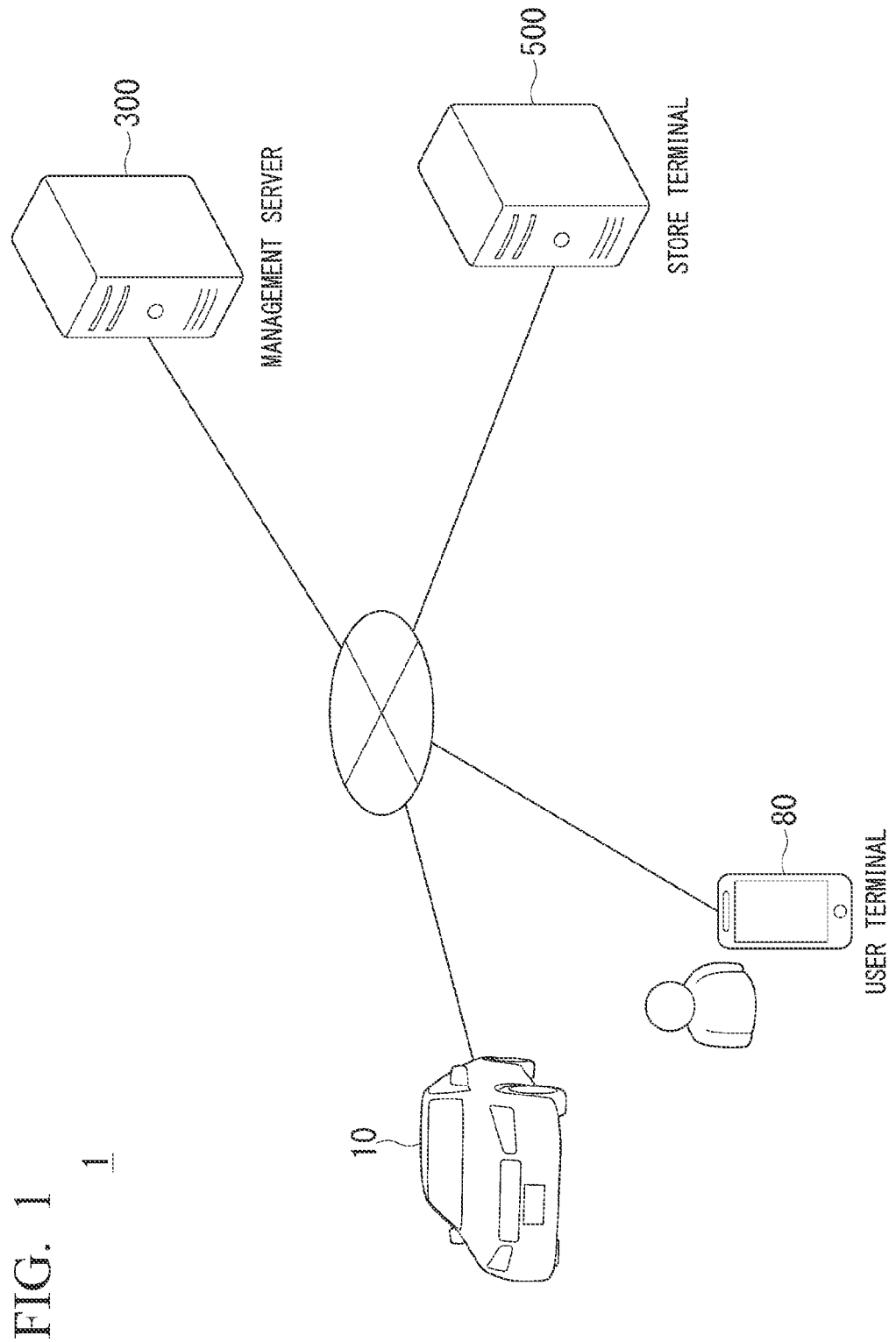
FIG. 1 is a diagram which shows an example of a management system including a management device of the present invention.

Hereinafter, embodiments of a management device, a management method, and a program of the present invention will be described with reference to the drawings. FIG. 1 is a diagram which shows an example of a management system 1 including the management device of the present invention. As shown in FIG. 1, the management system 1 includes, for example, a vehicle 10, a user terminal 80, a management server 300, and a store terminal 500. The vehicle 10, the user terminal 80, the management server 300, and the store terminal 500 are connected via a network NW. The network NW includes, for example, the Internet, a wide area network (WAN), a local area network (LAN), a provider device, a wireless base station, and the like.

The vehicle 10 is, for example, an electric vehicle in which a secondary battery is mounted or an electric vehicle in which a secondary battery can be replaced. The vehicle 10 is a vehicle that can accumulate electric power from the outside, and may be a vehicle in which a secondary battery for supplying electric power for traveling is mounted, and may also be a hybrid vehicle or a fuel cell vehicle. In addition, the vehicle 10 may be a four-wheeled vehicle, a three-wheeled vehicle, a saddle-riding vehicle, an electrically assisted bicycle, a cultivator, a management machine, a walking assist device, a kickboard, or the like in which a secondary battery is mounted or can be replaced.

The user terminal 80 is a terminal owned by a user, and is, for example, a smartphone, a tablet terminal, a personal computer, or the like.

The management server 300 manages a usage state of a secondary battery mounted in the vehicle 10 based on, for example, information received from the vehicle 10 and the like. The management server 300 selects a battery suitable for a user based on the usage state of the secondary battery and the like. The details will be described below.

The store terminal 500 is, for example, a computer installed in a store such as a dealer, and includes a keyboard, a mouse, a display, and the like. When an item answered by a user is input by a clerk, the store terminal 500 generates user answer information and sends it to the management server 300 via the network NW.

Vehicle

Figure 2:
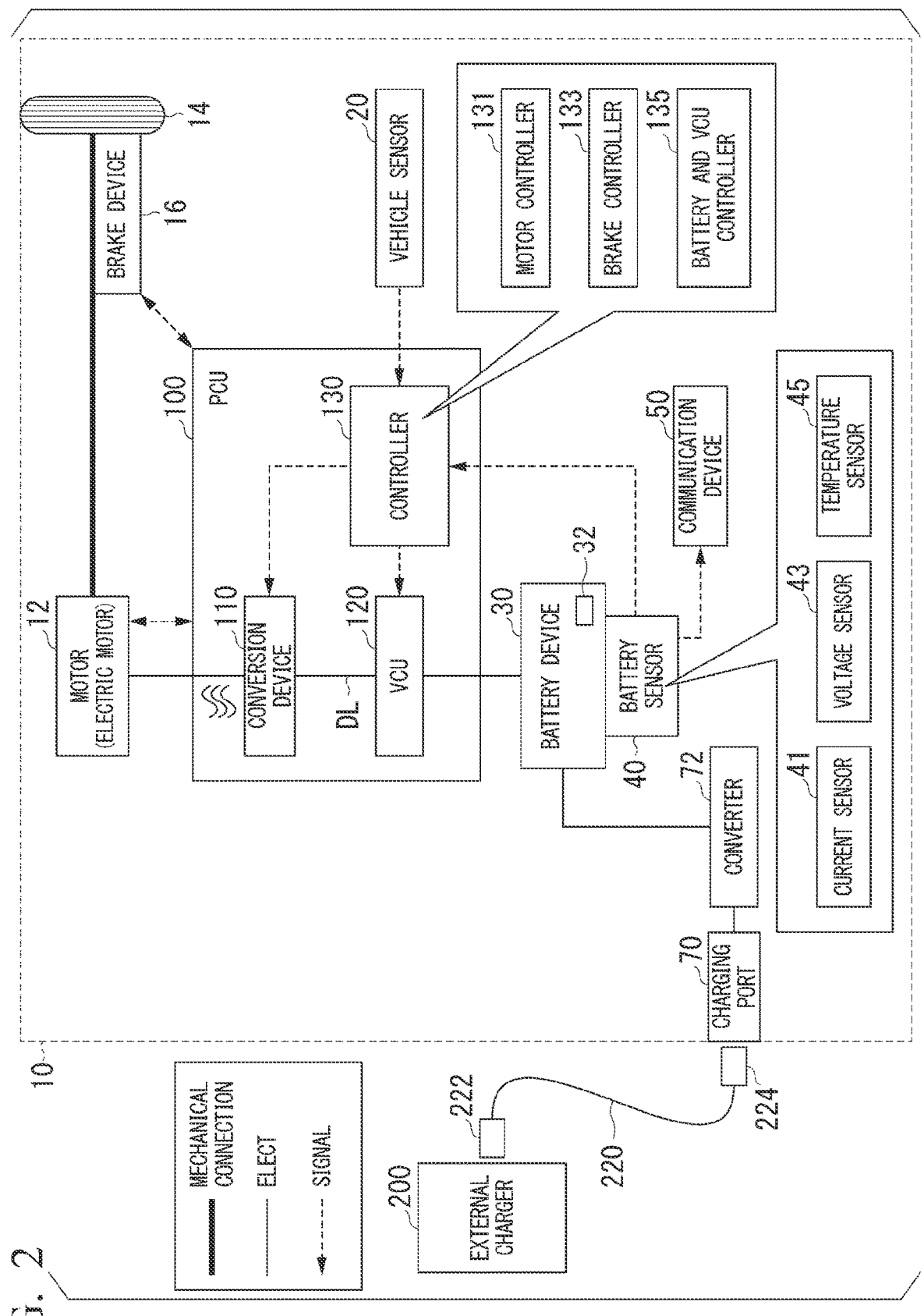
FIG. 2 is a diagram which shows an example of a configuration of a vehicle.

FIG. 2 is a diagram which shows an example of a configuration of the vehicle 10. The vehicle 10 includes, for example, a motor 12, a drive wheel 14, a brake device 16, a vehicle sensor 20, a battery device 30, a battery sensor 40, a communication device 50, a charging port 70, a converter 72, and a power control unit (PCU) 100. The PCU 100 is an example of a control device.

The motor 12 is, for example, a three-phase alternating current motor. A rotor of the motor 12 is connected to the drive wheel 14. The motor 12 outputs power to the drive wheel 14 by using the supplied electric power. Moreover, the motor 12 generates electricity by using motion energy of the vehicle when the vehicle decelerates.

The brake device 16 includes, for example, a brake caliper, a cylinder that transmits a hydraulic pressure to the brake caliper, and an electric motor that generates a hydraulic pressure in the cylinder. The brake device 16 may include a mechanism for transmitting a hydraulic pressure generated by an operation of a brake pedal to the cylinder via a master cylinder as a backup. The brake device 16 is not limited to the configuration described above, and may be an electronically controlled hydraulic brake device that transmits a hydraulic pressure of the master cylinder to the cylinder.

The vehicle sensor 20 includes, for example, an accelerator opening sensor, a vehicle speed sensor, and a brake stepping amount sensor. The accelerator opening sensor is attached to an accelerator pedal, which is an example of an operator that receives an acceleration instruction from a driver, detects the operation amount of the accelerator pedal, and outputs it to the PCU 100 as an accelerator opening. The vehicle speed sensor includes, for example, a wheel speed sensor attached to each wheel and a speed calculator, integrates wheel speeds detected by the wheel speed sensor to derive a speed of the vehicle (a vehicle speed), and outputs it to the PCU 100. The brake stepping amount sensor is attached to a brake pedal, detects an operation amount of the brake pedal, and outputs it to the PCU 100 as a brake stepping amount.

The PCU 100 includes, for example, a conversion device 110, a voltage control unit (VCU) 120, and a controller 130. The conversion device 110 is, for example, an AC-DC conversion device. A DC side terminal of the conversion device 110 is connected to a direct current link DL. The battery device 30 is connected to the direct current link DL via the VCU 120. The conversion device 110 converts an alternating current generated by the motor 12 into a direct current and outputs it to the direct current link DL. The VCU 120 is, for example, a DC-DC converter. The VCU 120 boosts electric power supplied from the battery device 30 and outputs it to the direct current link DL.

The controller 130 includes, for example, a motor controller 131, a brake controller 133, and a battery and VCU controller 135. The motor controller 131, the brake controller 133, and the battery and VCU controller 135 may be replaced with separate control devices such as a motor ECU, a brake ECU, and a battery ECU. The controller 130 controls operations of each part of the vehicle 10, such as the conversion device 110, the VCU 120, and the battery device 30.

The controller 130 is realized by, for example, a hardware processor such as a central processing unit (CPU) executing a program (software). Some or all of these components may be realized by hardware (a circuit unit; including circuitry) such as large-scale integration (LSI), an application specific integrated circuit (ASIC), a field-programmable gate array (FPGA), or a graphics processing unit (GPU), and may also be realized by software and hardware in cooperation.

The program may be stored in advance in a storage device (a non-transient storage medium) such as a hard disk drive (HDD) or a flash memory, or may also be stored in a removable storage medium (non-transient storage medium) such as a DVD or a CD-ROM and installed by the storage medium being mounted in a drive device.

The motor controller 131 controls the motor 12 based on an output of the vehicle sensor 20. The brake controller 133 controls the brake device 16 based on the output of the vehicle sensor 20.

The battery and VCU controller 135 controls an output of the battery device 30. For example, the battery and VCU controller 135 calculates a state of charge (SOC) of the battery 32 based on an output of the battery sensor 40 attached to a battery 32 of the battery device 30 (to be described below) and outputs it to the VCU 120. The VCU 120 causes a voltage of the direct current link DL to rise in response to an instruction from the battery and VCU controller 135. Details of the battery device 30 will be described below.

The battery sensor 40 includes, for example, a current sensor 41, a voltage sensor 43, a temperature sensor 45, and the like. The battery sensor 40 detects, for example, a current value, a voltage value, a temperature, and the like for charging and discharging the battery 32. The battery sensor 40 outputs the detected current value, voltage value, temperature, and the like to the controller 130 and the communication device 50. The battery sensor 40 may be accommodated in a housing of the battery device 30 or may be attached to the outside of the housing. In the following description, the current value, the voltage value, the temperature, and the like detected by the battery sensor 40 will be referred to as battery parameters.

The communication device 50 includes a wireless module for connecting wireless communication networks such as a wireless LAN or a cellular network. The wireless LAN may use a method such as Wi-Fi (registered trademark), Bluetooth (registered trademark) or Zigbee (registered trademark). The cellular network may be, for example, a third-generation mobile communication network (3G), a fourth-generation mobile communication network (Long Term Evolution: LTE (registered trademark)), a fifth-generation mobile communication network (5G), or the like. The communication device 50 may acquire the current value, the voltage value, the temperature, and the like output from the battery sensor 40 and transmit them to the outside.

The charging port 70 is provided toward the outside of a vehicle body of the vehicle 10. The charging port 70 is connected to an external charger 200 via a charging cable 220. The charging cable 220 includes a first plug 222 and a second plug 224. The first plug 222 is connected to the external charger 200, and the second plug 224 is connected to the charging port 70. Electricity supplied from the external charger 200 is supplied to the charging port 70 via the charging cable 220.

In addition, the charging cable 220 includes a signal cable attached to a power cable. The signal cable mediates communication between the vehicle 10 and the external charger 200. For this reason, each of the first plug 222 and the second plug 224 is provided with a power connector and a signal connector.

The converter 72 is provided between the battery device 30 and the charging port 70. The converter 72 converts a current introduced from the external charger 200 via the charging port 70, for example, an alternating current, into a direct current. The converter 72 outputs the converted direct current to the battery device 30.

Management Server

Figure 3:
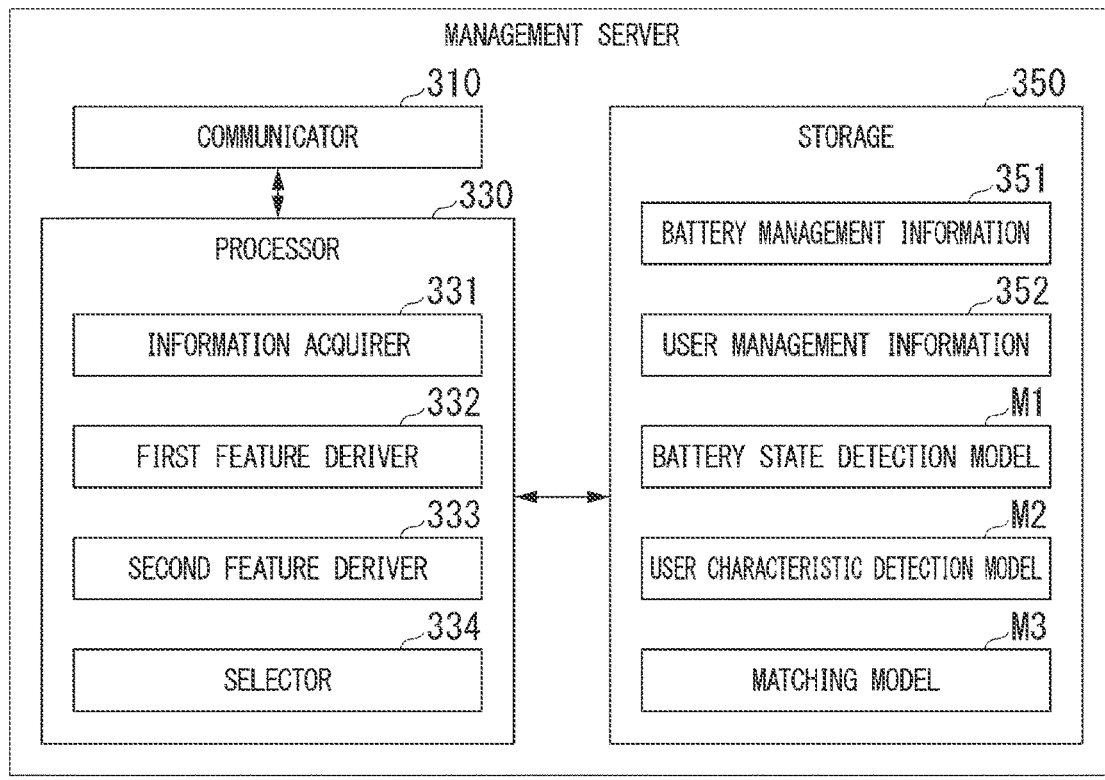
FIG. 3 is a diagram which shows an example of a configuration of a management server.

FIG. 3 is a diagram which shows an example of the configuration of the management server 300. The management server 300 includes, for example, a communicator 310, a processor 330, and a storage 350. The communicator 310 includes, for example, a wireless module for connecting a wireless communication network such as a wireless LAN or a cellular network. The wireless LAN may use a method such as Wi-Fi (registered trademark), Bluetooth (registered trademark) or Zigbee (registered trademark). The cellular network may be, for example, a third-generation mobile communication network (3G), a fourth-generation mobile communication network (Long Term Evolution: LTE (registered trademark)), a fifth-generation mobile communication network (5G), or the like.

The storage 350 may be, for example, a storage device (a non-transient storage medium) such as a hard disk drive (HDD) or a flash memory, or may further include a control circuit for enabling or disabling writing of information in the storage device or reading of information from the storage device, in addition to the storage device such as an HDD or a flash memory. The storage 350 stores, for example, battery management information 351, user management information 352, a battery state detection model M1, a user characteristic detection model M2, a matching model M3, and the like. This information is written by the processor 330 or read by the processor 330.

The processor 330 includes, for example, an information acquirer 331, a first feature deriver 332, a second feature deriver, and a selector 334. The processor 330 is realized by, for example, a processor such as a CPU executing a program (software) stored in the storage 350. In addition, some or all of these functional parts included in the processor 330 may be realized by hardware (a circuit unit; including circuitry) such as LSI, an ASIC, an FPGA, or a GPU, or may also be realized by software and hardware in cooperation. The program may be stored in advance in a storage device (a non-transient storage medium) such as an HDD or a flash memory or may be stored in a removable storage medium (a non-transient storage medium) such as a DVD or CD-ROM, and installed by the storage medium being mounted in a drive device.

The information acquirer 331 acquires battery information on a usage state of the battery 32 mounted in the vehicle 10 and a vehicle ID from the vehicle 10 and stores them in the storage 350 as the battery management information 351. The battery information includes, for example, a detection result of battery parameters (for example, a current value, a voltage value, a temperature, and the like) acquired from the battery sensor 40. The battery management information 351 includes battery information associated with a vehicle ID. The vehicle ID is identification information that identifies a specific vehicle.

In addition, the information acquirer 331 acquires information on a user from the vehicle 10. The information acquirer 331 may receive the information on a user from the user terminal 80 or the store terminal 500 via the network NW. The information on the user includes, for example, user answer information including an answer of the user to a predetermined questionnaire, a user ID that is identification information for identifying an individual user, and the like. The predetermined questionnaire includes, for example, a frequency of driving, a frequent driving time period of a day, a frequently visited area, whether the user frequently takes trips or drives nearby, and the like. For example, the information acquirer 331 associates a user ID with user answer information, and stores them in the storage 350 as a part of the user management information 352.

The first feature deriver 332 derives a first feature indicating a state of the battery 32 based on a result obtained by applying the battery information to the battery state detection model M1, and outputs a result of the derivation to the selector 334.

Figure 4:
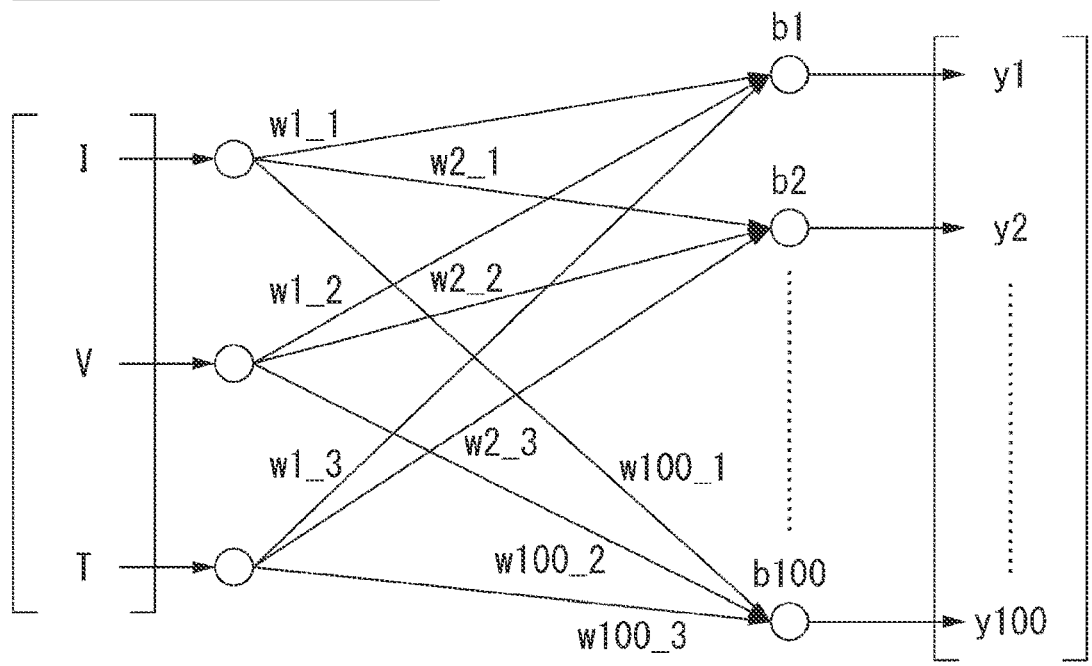
FIG. 4 is a diagram which shows an example of a battery state detection model.

FIG. 4 is a diagram which shows an example of the battery state detection model M1. The battery state detection model M1 of the example shown in FIG. 4 is a model in which a current value (I), a voltage value (V), and a temperature (T) are input, and a first feature (y1, y2, . . . , y100) is obtained. The number of intermediate layers, a weighting coefficient, and the number of the first features shown in FIG. 4 are examples, and are not limited thereto. In addition, the number of inputs to the model is not limited to this, and may be counted as long as there are two or more of a current value, a voltage value, and a temperature. Moreover, as will be described below, time-series change information of the battery 32, deterioration information of the battery 32, and the like may be input to the model. The battery information to be input to the model is not limited to a current value, a voltage value and a temperature, but may also be, for example, a state of charge (SOC) calculated from a current value and a voltage value, and a resistance of the battery 32 calculated from a current value and a voltage value, and the like.

Figure 5:
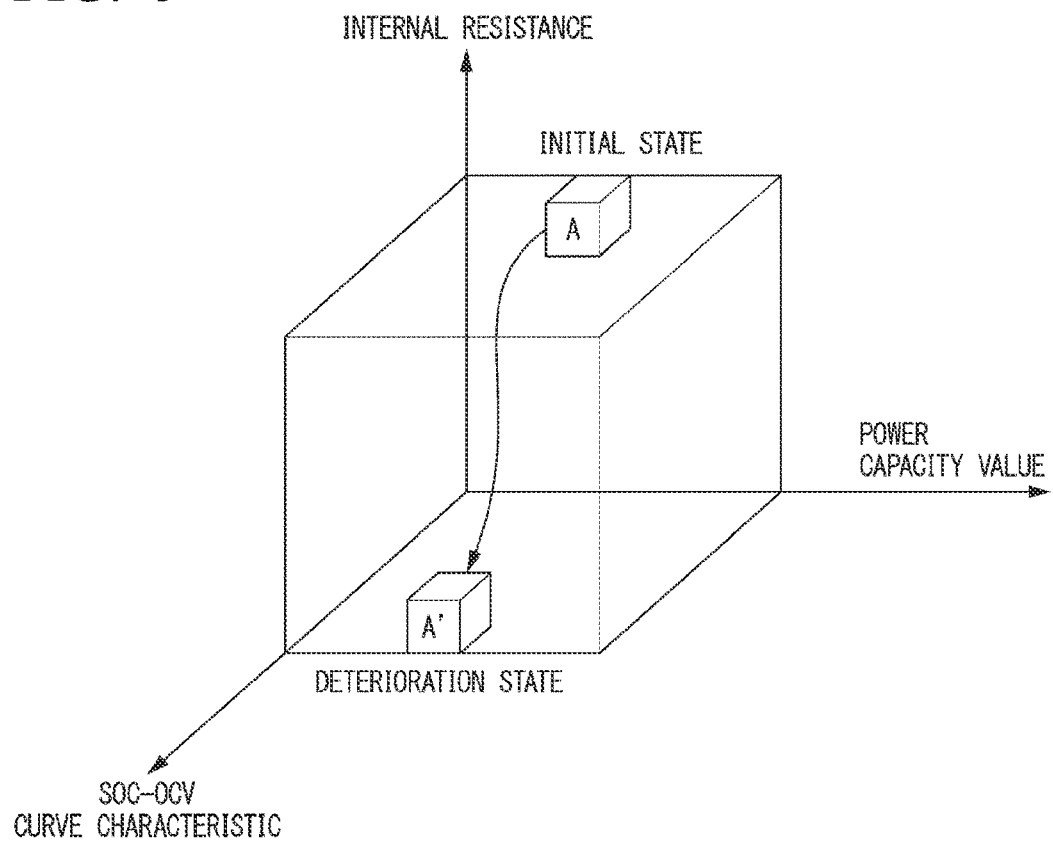
FIG. 5 is a diagram which shows an example of a three-dimensional space model that identifies a state of a battery.

The first feature deriver 332 may derive the feature that identifies the state of a battery by expressing the first feature of the battery obtained by using the battery state detection model M1 with, for example, a three-dimensional space model, and output it to the selector 334 as the first feature. FIG. 5 is a diagram which shows an example of the three-dimensional space model that identifies the state of the battery. The three-dimensional space model is, for example, a space model defined in three dimensions of a power capacity value of the battery, an internal resistance of the battery, and an SOC-OCV curve characteristic of the battery. The first feature deriver 332 derives the first feature that identifies the state of the battery based on transition of the state in a three-dimensional space model shown in FIG. 5.

In addition, the first feature deriver 332 may express the first feature of the battery obtained by using the battery state detection model M1 with, for example, a radar chart, and output a feature that identifies the state of the battery by classifying a shape of the radar chart to the selector 334 as the first feature. The first feature deriver 332 may identify the feature by expressing it on a contour graph or the like.

The second feature deriver 333 derives a second feature indicating the characteristics of the user based on the information on the user.

For example, the second feature deriver 333 derives the second feature indicating the characteristics of the user and outputs a result of the derivation to the selector 334 based on a result obtained by applying the user answer information to the user characteristic detection model M2.

Figure 6:
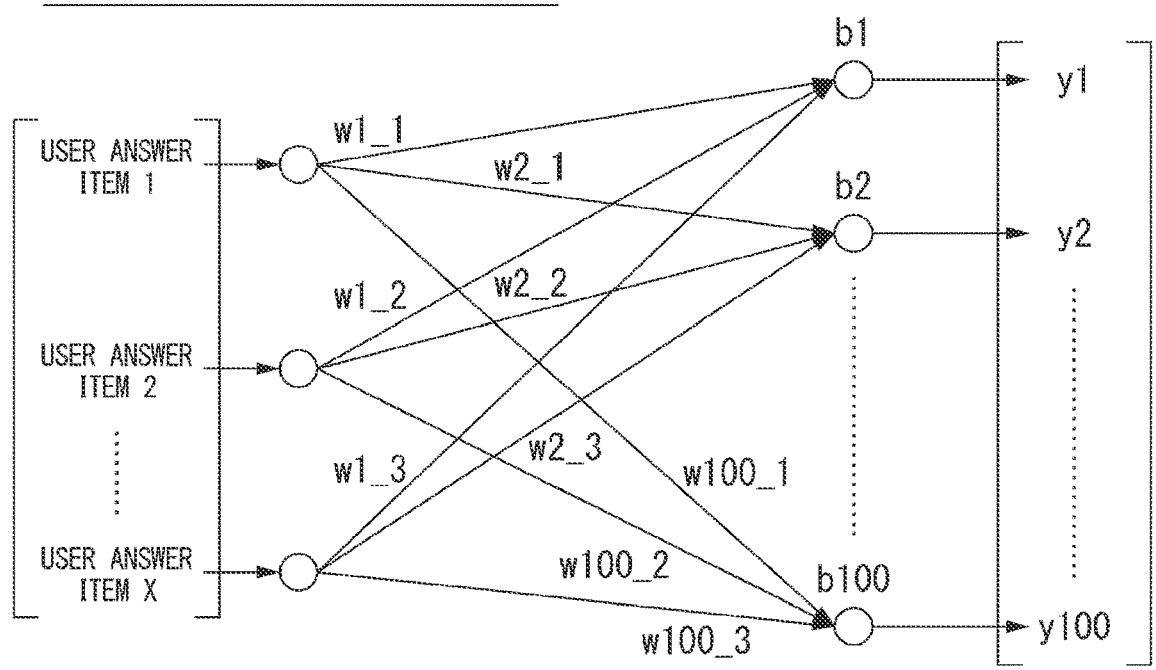
FIG. 6 is a diagram which shows an example of a user characteristic detection model.

FIG. 6 is a diagram which shows an example of the user characteristic detection model M2. The user characteristic detection model M2 of the example shown in FIG. 6 is a model in which the second feature (y1, y2, . . . , y100) is obtained by inputting a user answer item 1, a user answer item 2, . . . , and a user answer item X. The number of intermediate layers, the weighting coefficient, and the number of the second features shown in FIG. 6 are examples, and are not limited thereto. In addition, the number of inputs to the model is not limited thereto.

Figure 7:
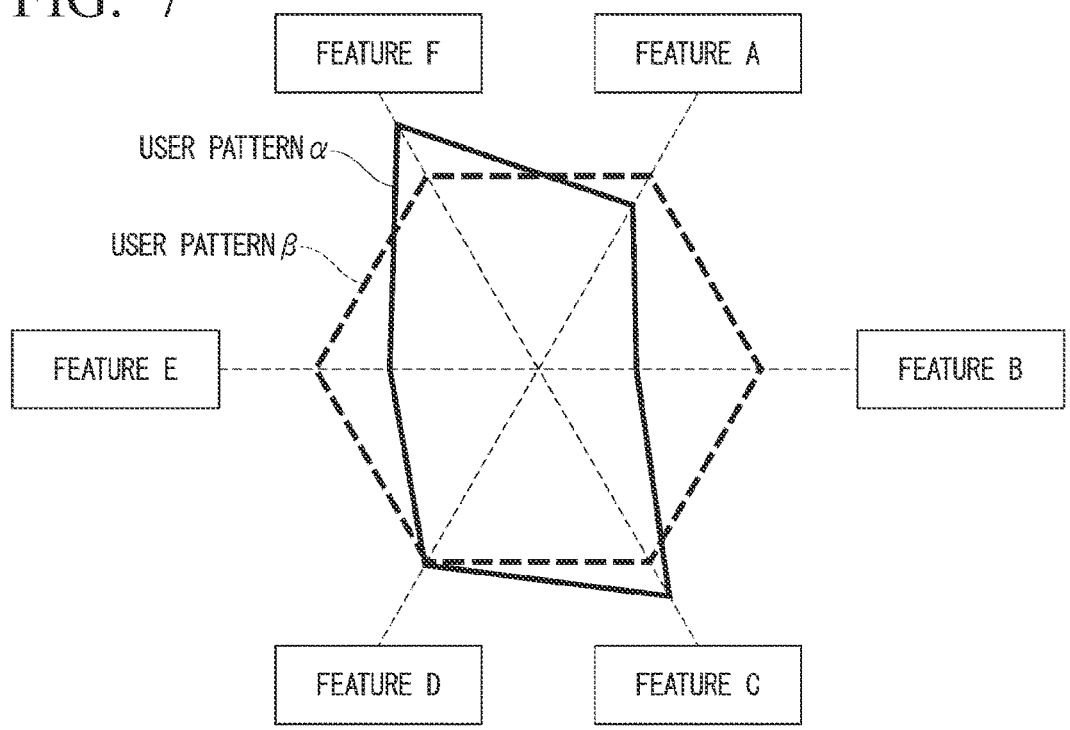
FIG. 7 is a diagram which shows an example of a radar chart that shows characteristics of a user.

Moreover, the second feature deriver 333 may express the second feature of the user characteristics obtained by using the user characteristic detection model M2 with, for example, a radar chart, and output a feature that identifies the characteristics of the user by classifying the shape of the radar chart to the selector 334 as the second feature. FIG. 7 is a diagram which shows an example of a radar chart indicating the characteristics of the user. The radar chart has the first features A to F as the vertices. In FIG. 7, a user pattern α and a user pattern β, which show the characteristics of different users, are displayed. The second feature deriver 333 may identify a feature by expressing it on a contour graph or the like.

The selector 334 selects a battery suitable for a user (hereinafter referred to as an optimum battery) based on a result obtained by inputting the first feature and the second feature to the matching model M3. The matching model M3 outputs a result showing compatibility between a user and a battery based on the first feature and the second feature.

Figure 8:
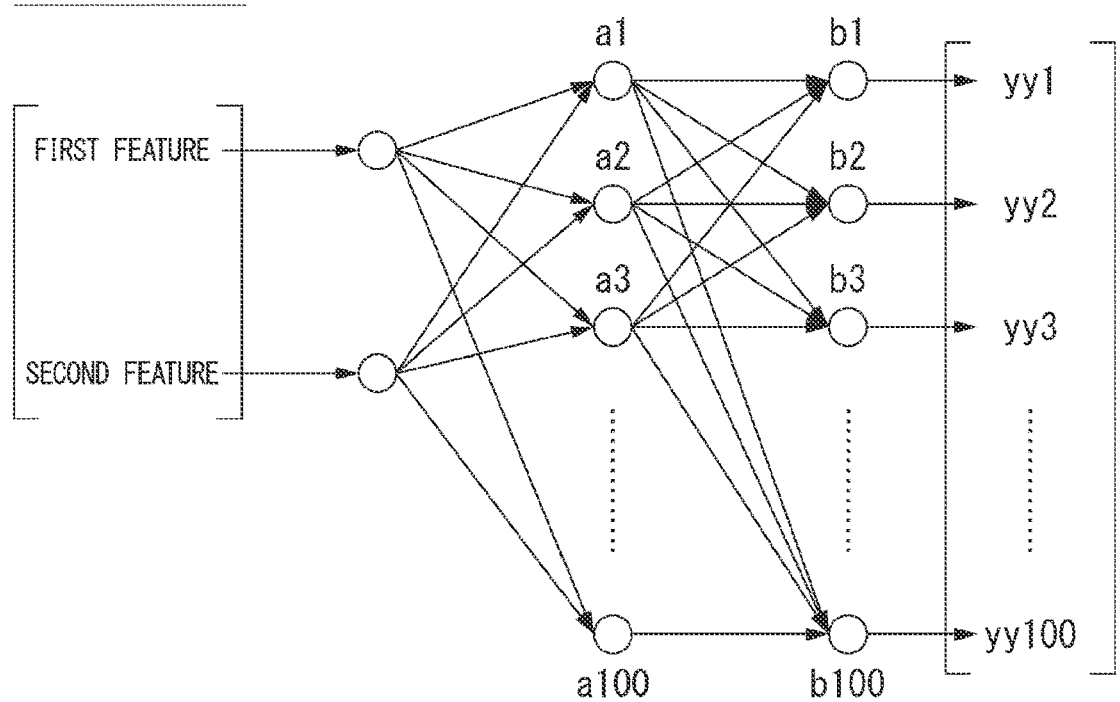
FIG. 8 is a diagram which shows an example of a matching model.

FIG. 8 is a diagram which shows an example of the matching model M3. The matching model M3 of the example shown in FIG. 8 is a model in which a third feature (yy1, yy2, . . . , yy100) for identifying an optimum battery is obtained by inputting the first feature and the second feature. The number of intermediate layers, a weighting coefficient, and the number of third features shown in FIG. 8 are examples, and are not limited thereto. In the example shown in FIG. 8, an example in which the first feature and the second feature are input to the matching model M3 has been described, but the present invention is not limited thereto. An input to the model may be information indicating the state of a battery identified based on the first feature, or information indicating the characteristics of the user identified based on the second feature.

Moreover, the selector 334 may express the third feature obtained by using the matching model M3 with, for example, a radar chart, and identify an optimum battery by classifying the shape of the radar chart.

Figure 9:
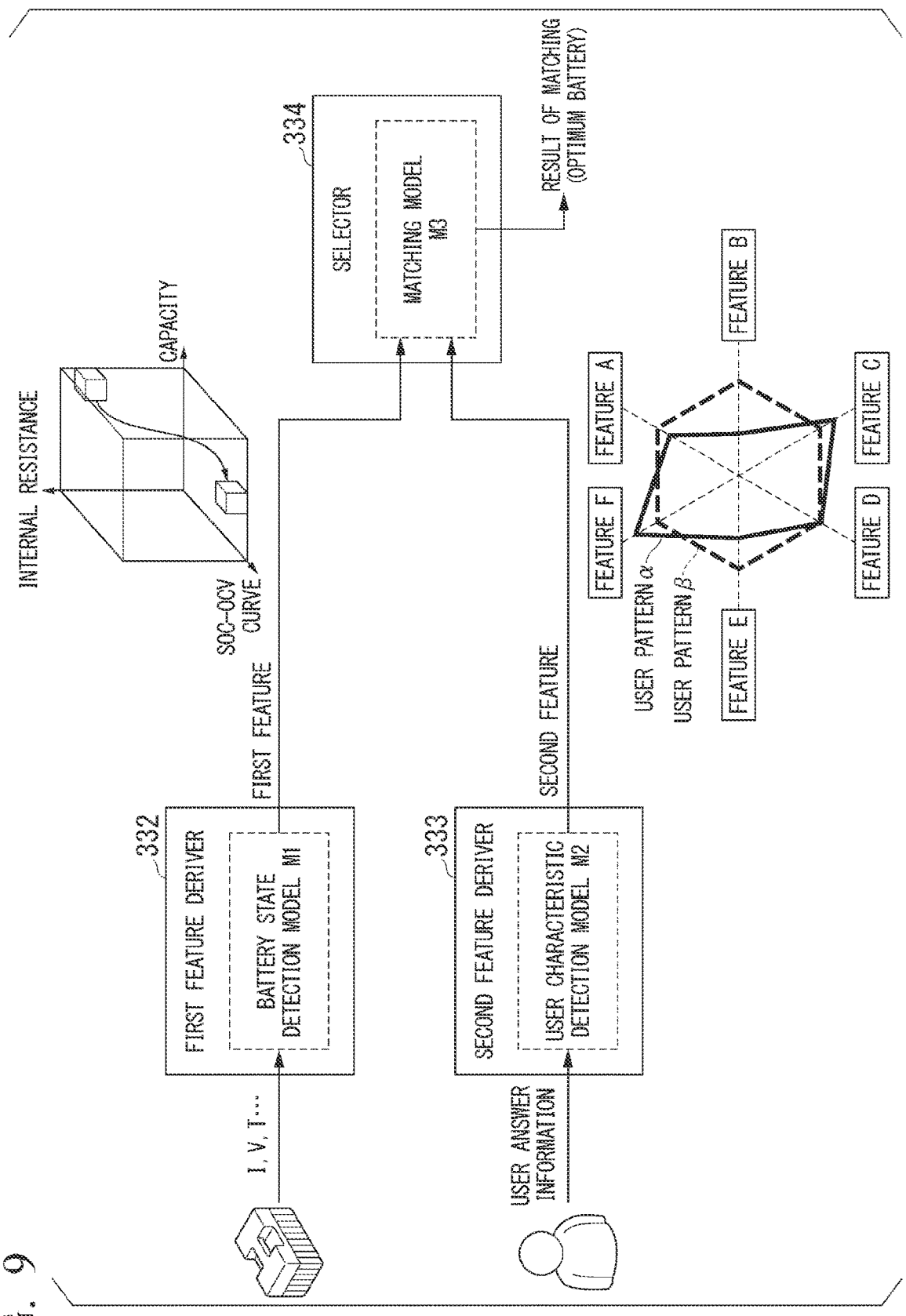
FIG. 9 is an example that shows an outline of processing by a part of a processor 330 of the management server.

FIG. 9 is an example which shows an outline of processing by a part of the processor 330 of the management server 300. The first feature deriver 332 derives a first feature that indicates the state of the battery 32 and outputs a result of the derivation to the selector 334 based on a result obtained by applying battery information indicating a current (I), a voltage (V), a temperature (T), and the like to battery state detection model M1. On the other hand, the second feature deriver 333 derives a second feature that indicates the characteristics of a user and outputs a result of the derivation to the selector 334 based on a result obtained by applying user answer information to the user characteristic detection model M2. The selector 334 selects an optimum battery based on a result obtained by inputting the first feature and the second feature to the matching model M3.

Figure 10:
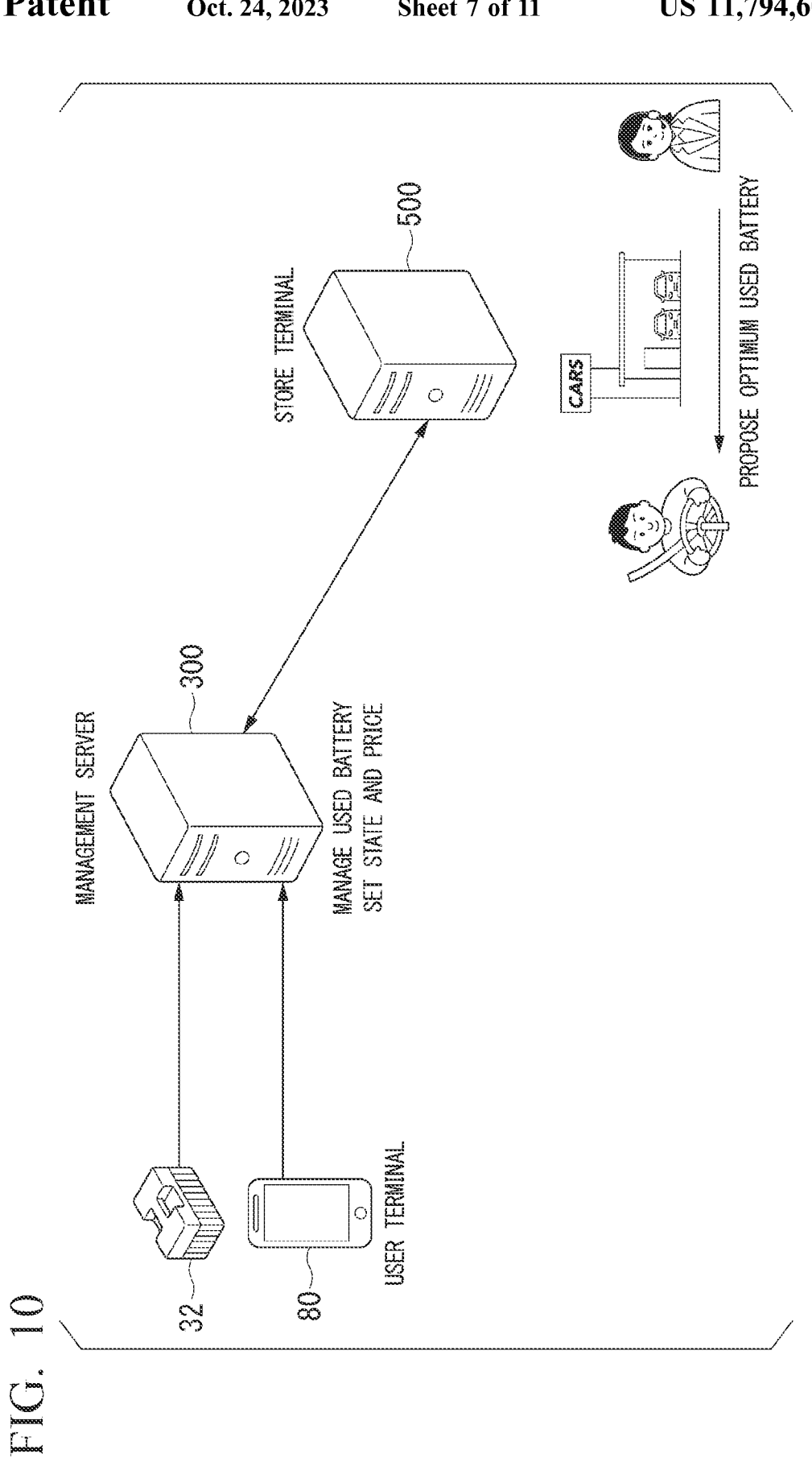
FIG. 10 is a reference diagram that describes a specific example of a first embodiment.

FIG. 10 is a reference diagram which describes a specific example of the first embodiment. For example, the management server 300 manages battery information on a used battery and derives a first feature related to the used battery. In addition, the management server 300 derives a second feature related to a user based on the user answer information received from the user terminal 80 or the store terminal 500. Then, the management server 300 selects an optimum battery according to matching based on the first feature related to a used battery and the second feature related to a user, and transmits a result of the selection to the store terminal 500. As a result, a dealer can propose a used battery suitable for the user to the user.

Figure 11:
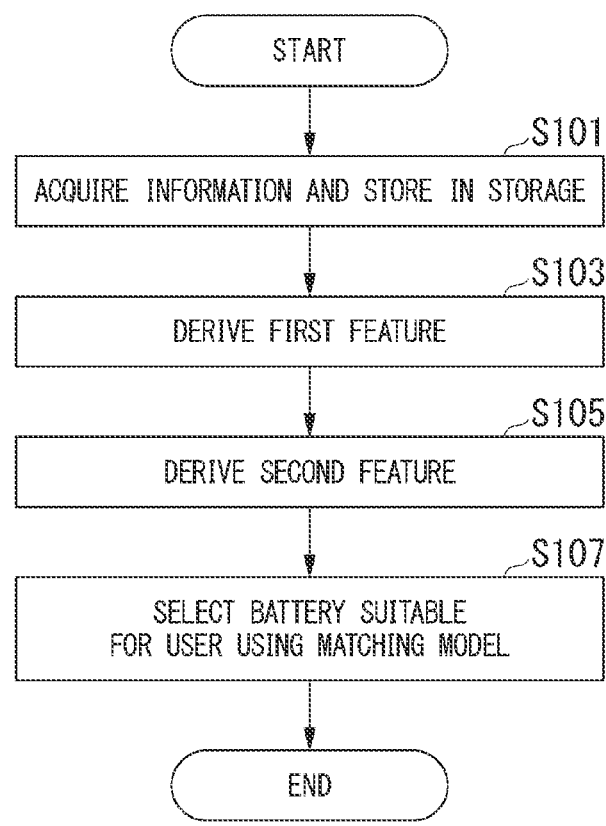
FIG. 11 is a flowchart which shows an example of a flow of processing by the processor.

FIG. 11 is a flowchart which shows an example of a flow of processing by the processor 330. First, the information acquirer 331 stores information received from the vehicle 10 in the storage 350 (step S101). The first feature deriver 332 derives a first feature that indicates the state of the battery 32 based on a result obtained by applying the battery information indicating a current (I), a voltage (V), a temperature (T), and the like to the battery state detection model M1 (step S103). The second feature deriver 333 derives a second feature that indicates the characteristics of a user based on a result obtained by applying user answer information to the user characteristic detection model M2 (step S105). The selector 334 selects an optimum battery based on a result obtained by inputting the first feature and the second feature to the matching model M3 (step S107).

SUMMARY OF EMBODIMENT

As described above, the management server 300 of the present embodiment includes the information acquirer 331 that acquires battery information on the usage state of a secondary battery mounted in the vehicle 10 and information on a user from the vehicle 10, the first feature deriver 332 that derives a first feature indicating the state of the secondary battery based on a result obtained by applying the battery information to a battery state detection model that identifies the state of the secondary battery, the second feature deriver 333 that derives a second feature indicating the characteristics of the user based on the information on the user, and the selector 334 that selects a battery suitable for the user based on a result obtained by inputting the first feature and the second feature to a matching model, which outputs a result showing compatibility between the user and the battery based on the first feature and the second feature, thereby proposing the battery suitable for the user.

Second Embodiment

Next, the second embodiment will be described. The second embodiment is different in that the information acquirer 331 acquires vehicle information on a traveling state of the vehicle 10 as the information on a user. In the following description, points different from those of the first embodiment will be described, and description of the same points will be omitted.

Figure 12:
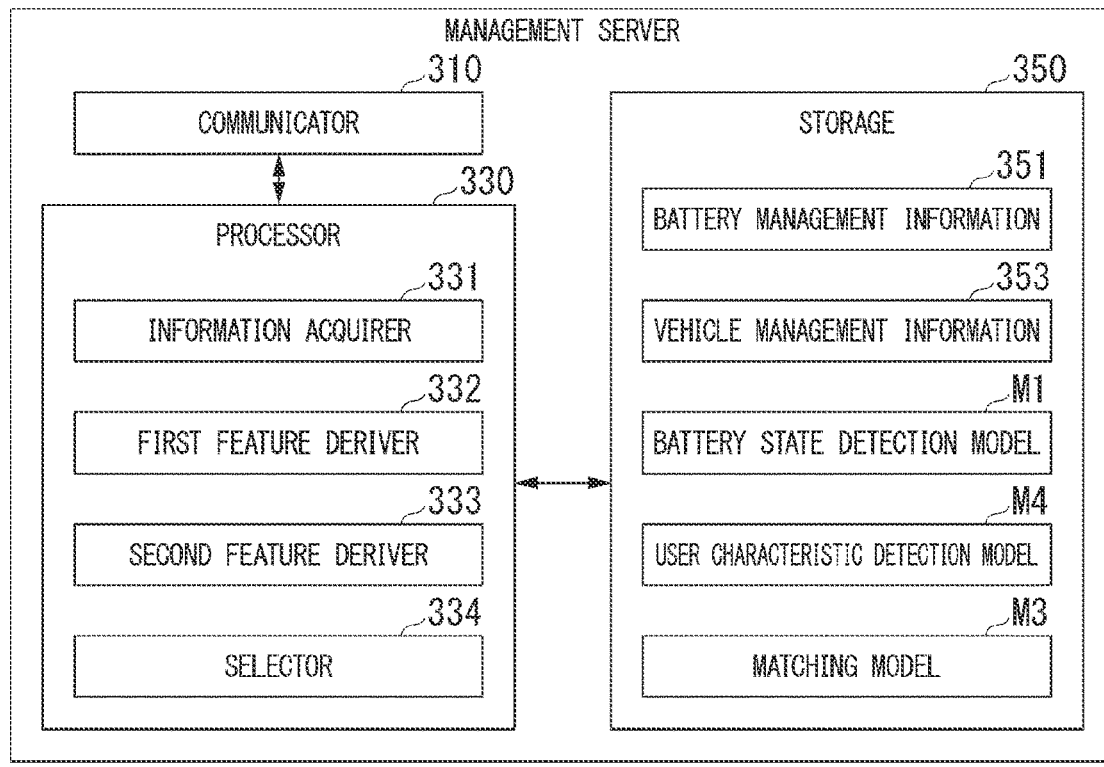
FIG. 12 is a diagram which shows an example of a configuration of a management server.

FIG. 12 is a diagram which shows an example of a configuration of a management server 300A. The management server 300A differs from the management server 300 in that the vehicle management information 353 instead of the user management information 352, and the user characteristic detection model M4 instead of the user characteristic detection model M2 are stored in the storage 350.

Figure 13:
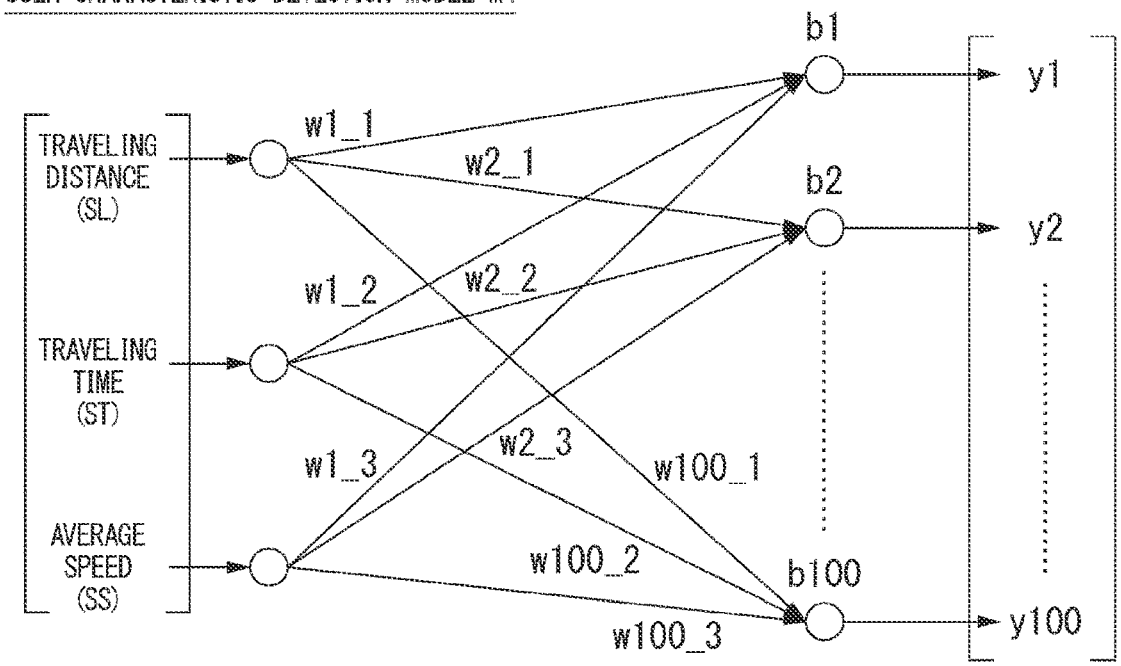
FIG. 13 is a diagram which shows an example of a user characteristic detection model.

FIG. 13 is a diagram which shows an example of the user characteristic detection model M4. The user characteristic detection model M4 of the example shown in FIG. 12 is a model in which the second feature (y1, y2, . . . , or y100) is obtained by inputting a traveling distance (SL), a traveling time (ST), and an average speed (SS). The traveling distance is, for example, an integrated traveling distance from a start of use of the vehicle 10. In addition, the traveling time is, for example, an integrated traveling time from the start of use of the vehicle 10. The average speed is, for example, a value obtained by dividing the integrated traveling distance from the start of use of the vehicle 10 by the integrated traveling time. The number of intermediate layers, a weighting coefficient, and the number of the second features shown in FIG. 12 are examples, and are not limited thereto. Moreover, the number of inputs to the model is not limited thereto, and may be counted as long as there are two or more of a traveling distance, a traveling time, and a speed.

In addition, the second feature deriver 333 may express a second feature that indicates the characteristics of a user obtained by using the user characteristic detection model M4 with, for example, a radar chart, and output a feature that identifies the characteristics of the user by classifying the shape of the radar chart to the selector 334 as the second feature.

Figure 14:
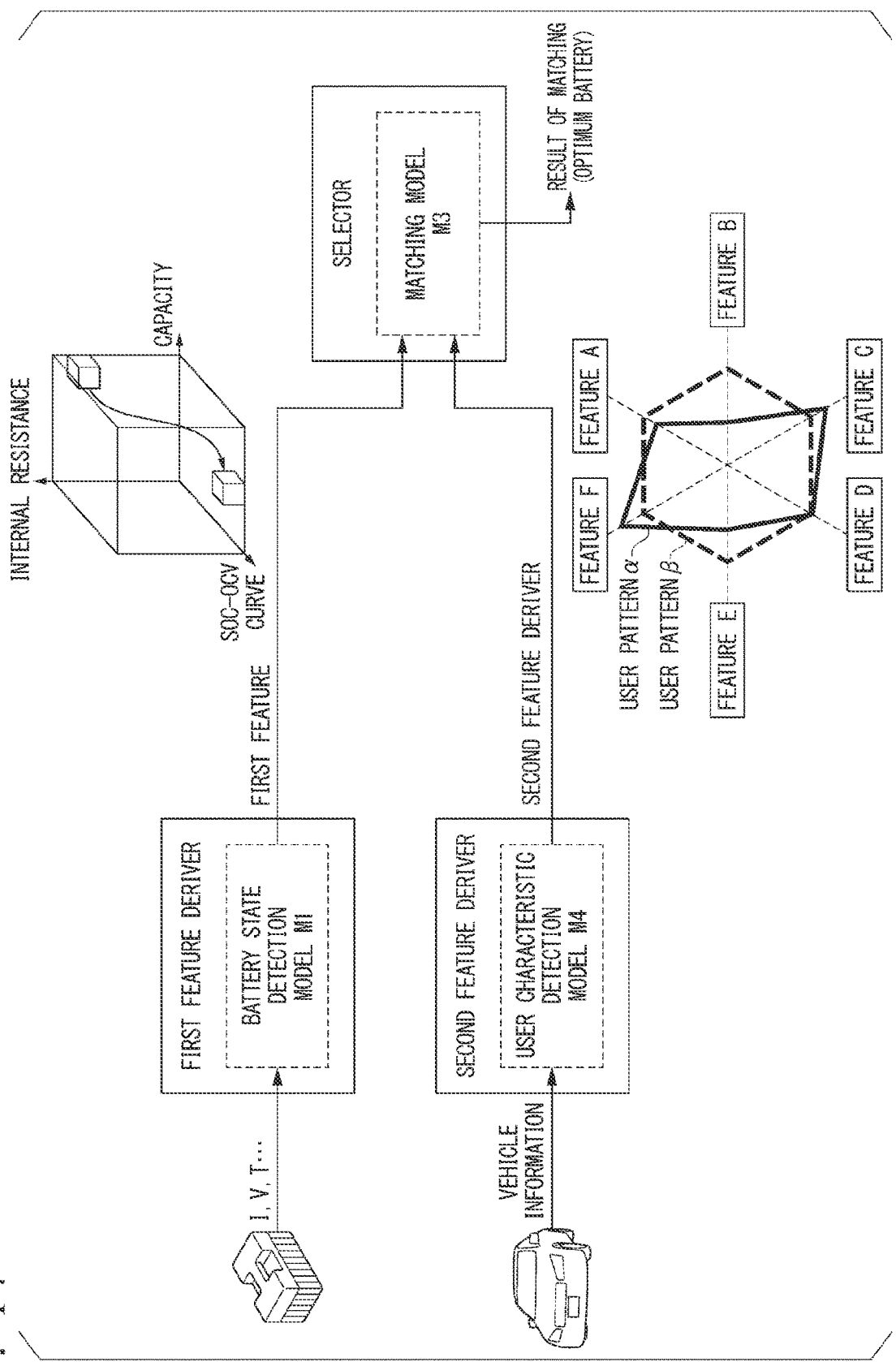
FIG. 14 is an example which shows an outline of processing by a part of a processor of the management server.

FIG. 14 is an example which shows an outline of processing by a part of the processor 330 of the management server 300A. The first feature deriver 332 derives a first feature that indicates the state of the battery 32 based on a result obtained by applying the battery information indicating a current (I), a voltage (V), a temperature (T), and the like to the battery state detection model M1, and outputs a result of the derivation to the selector 334. On the other hand, the second feature deriver 333 derives a second feature that indicates the characteristics of a user based on a result obtained by applying vehicle information to the user characteristic detection model M4, and outputs a result of the derivation to the selector 334. The selector 334 selects an optimum battery based on a result obtained by inputting the first feature and the second feature to the matching model M3.

FIG. 15 is a reference diagram which describes a specific example of the second embodiment. For example, the management server 300A manages battery information on the battery 32 mounted in a vehicle 10 of a user A, and derives a first feature related to a battery used by the user A. Moreover, the management server 300 derives a second feature on a user B based on vehicle information received from a vehicle 10 of the user B. Then, the management server 300 selects an optimum battery suitable for the user B by a matching based on first features for a plurality of batteries and a second feature for the user B, and transmits a result of the selection to the store terminal 500. In this manner, the dealer can propose a new battery suitable for the user B to the user B. For example, the management server 300A can select an optimum battery by designating a size of a battery, the number of stacking layers, the number of series and parallels, and the like.

The embodiments described above can be expressed as follows.

A management device is configured to include a storage device that stores a program, and a hardware processor, in which the hardware processor executes a program stored in the storage device, thereby acquiring battery information on a usage state of a secondary battery mounted in a vehicle, and information on a user from the vehicle, deriving a first feature indicating a state of the secondary battery based on a result obtained by applying the battery information to a battery state detection model that identifies the state of the secondary battery, deriving a second feature indicating characteristics of the user based on the information on the user, and selecting a battery suitable for the user based on a result obtained by inputting the first feature and the second feature to a matching model that outputs a result showing compatibility between the user and a battery based on the first feature and the second feature.

Although the embodiments for implementing the present invention have been described above using the embodiments, the present invention is not limited to these embodiments, and various modifications and substitutions can be made within a range not departing from the gist of the present invention.

What is claim is:
1. A management device comprising:
an information acquirer configured to acquire battery information on a usage state of a secondary battery mounted in a vehicle and information on a user from the vehicle;

a first feature deriver configured to derive a first feature indicating a state of the secondary battery based on a result obtained by applying the battery information to a battery state detection model that identifies the state of the secondary battery;

a second feature deriver configured to derive a second feature indicating characteristics of the user based on the information on the user; and a selector configured to select a battery suitable for the user based on a result obtained by inputting the first feature and the second feature to a matching model that outputs a result showing compatibility between the user and a battery based on the first feature and the second feature, wherein the information acquirer acquires a detection value indicating a usage state of the secondary battery as the battery information, and the first feature deriver derives a feature that identifies the state of the battery as the first feature, the first feature being a transition of states being a capacity of the secondary battery, an SOC-OCV curve of the secondary battery, and an internal resistance of the secondary battery in a three-dimensional space model defined by the capacity of the secondary battery, the SOC-OCV curve of the secondary battery, and the internal resistance of the secondary battery.

2. The management device according to claim 1,
wherein the information acquirer acquires vehicle information on a traveling state of the vehicle as the information on the user, and the second feature deriver derives the second feature based on a result obtained by applying the vehicle information to a user characteristic detection model that identifies characteristics of the user.

3. The management device according to claim 1,
wherein the information acquirer acquires information indicating a current, a voltage, and a temperature when the secondary battery is charged or discharged as the detection value.

4. A management method comprising:
by a computer,
acquiring battery information on a usage state of a secondary battery mounted in a vehicle and information on a user from the vehicle;

deriving a first feature indicating a state of the secondary battery based on a result obtained by applying the battery information to a battery state detection model that identifies the state of the secondary battery;

deriving a second feature indicating characteristics of the user based on the information on the user; and selecting a battery suitable for the user based on a result obtained by inputting the first feature and the second feature to a matching model that outputs a result showing compatibility between the user and a battery based on the first feature and the second feature, wherein the acquiring includes acquiring a detection value indicating a usage state of the secondary battery as the battery information, and deriving the first feature includes deriving a feature that identifies the state of the battery as the first feature, the first feature being a transition of states being a capacity of the secondary battery, an SOC-OCV curve of the secondary battery, and an internal resistance of the secondary battery in a three-dimensional space model defined by the capacity of the secondary battery, the SOC-OCV curve of the secondary battery, and the internal resistance of the secondary battery.

5. A program which causes a computer to execute:
acquiring battery information on a usage state of a secondary battery mounted in a vehicle and information on a user from the vehicle;

deriving a first feature indicating a state of the secondary battery based on a result obtained by applying the battery information to a battery state detection model that identifies the state of the secondary battery;

deriving a second feature indicating characteristics of the user based on the information on the user; and selecting a battery suitable for the user based on a result obtained by inputting the first feature and the second feature to a matching model that outputs a result showing compatibility between the user and a battery based on the first feature and the second feature wherein the acquiring includes acquiring a detection value indicating a usage state of the secondary battery as the battery information, and deriving the first feature includes deriving a feature that identifies the state of the battery as the first feature, the first feature being a transition of states being a capacity of the secondary battery, an SOC-OCV curve of the secondary battery, and an internal resistance of the secondary battery in a three-dimensional space model defined by the capacity of the secondary battery, the SOC-OCV curve of the secondary battery, and the internal resistance of the secondary battery.

* * * * *